(12) United States Patent
Yamazaki

(10) Patent No.: US 6,208,685 B1
(45) Date of Patent: Mar. 27, 2001

(54) MATCHED FILTER

(75) Inventor: Hiroshi Yamazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/040,418

(22) Filed: Mar. 18, 1998

(30) Foreign Application Priority Data

Apr. 30, 1997 (JP) .................................................. 9-113121

(51) Int. Cl.[7] .............................. H04L 27/30; H03K 5/10
(52) U.S. Cl. ............................ 375/152; 375/150; 327/91
(58) Field of Search .................................. 375/152, 142, 375/147, 150, 343; 708/422, 425, 426; 327/91; 329/361

(56) References Cited

U.S. PATENT DOCUMENTS

| | | | |
|---|---|---|---|
| 4,322,697 | * 3/1982 | Carbrey | 333/173 |
| 5,039,879 | * 8/1991 | Parrish | 327/306 |
| 5,510,737 | * 4/1996 | Arvidsson | 327/91 |
| 5,844,937 | * 12/1998 | Zhou et al. | 375/207 |
| 5,920,591 | * 7/1999 | Fukasawa et al. | 375/208 |
| 5,943,362 | * 8/1999 | Saito | 375/200 |

* cited by examiner

*Primary Examiner*—Chi Pham
*Assistant Examiner*—Khai Tran
(74) *Attorney, Agent, or Firm*—Staas & Halsey LLP

(57) ABSTRACT

An average value calculating circuit comprises capacitors C1 to Cn with one end of each capacitor supplied with reference voltage VSS, switching elements SW11 to SW1n connected between inputs D1 to Dn and the other ends of capacitors C1 to Cn, respectively, common wiring COM, switching elements SW21 to SW2n connected between the other ends of capacitors C1 to Cn and common wiring COM and resetting switching element SWr with one end connected to common wiring COM and the other end supplied with reference voltage VTT. When one of a group consisting of switching elements SW11 to SW1n and SWr and another group consisting of switching elements SW21 to SW2n is on, the others are off, substantially.

14 Claims, 9 Drawing Sheets

MATCHED FILTER

BACKGROUND OF THE INVENTION

1. Field of the Invention

The present invention relates to an average value calculating circuit, and a correlation value calculating circuit, a matched filter and a communication device using the same.

2. Description of the Related Art

FIG. 8 is a schematic block diagram showing a prior art receiver for direct sequence (DS) spread spectrum communication.

A signal received by antenna 7 selectively passes through band-pass filter 8 and is provided to detecting circuit 9. Detecting circuit 9 performs envelope or synchronous detection of the signal modulated according to ASK, FSK or PSK and converts it into analog or digital spread spectrum signal DIN. Matched filter 10P calculates correlation value DOUT between spread spectrum signal DIN and a pseudorandom noise (PN). Determining circuit 11 determines the symbol duration for acquisition based on correlation value DOUT and obtains baseband data. To reduce the amount of data, if the baseband data are coded, for example, according to predictive coding, the baseband data are decoded by decoding circuit 12. In the case of sound data, the output of decoding circuit 12 is converted into an analog value by digital-to-analog converter circuit 13, and then, passes through low-pass filter 14 and is provided to speaker 15. In the case of data such as image or text data, the output of the decoding circuit 12 is used as reproduction data.

The spread spectrum communication using such a receiver is superior to other communication schemes in interference wave excluding capability, concealability of the contents of communication and frequency use efficiency.

FIG. 9 shows the construction of conventional matched filter 10P.

In digital or analog shift register 20, delay elements DL1 to DLn are cascaded. To the data input of delay element DL1, spread spectrum signal DIN is provided. In synchronization with clock CLK, input signals DIN and S1 to Sn-i of delay elements DL1 to DLn are held therein and they output delay signals S1 to Sn. Delay elements DL1 to DLn are flip-flops if spread spectrum signal DIN is digital, and are sample-and-hold circuits or CCDs, etc. if the spread spectrum signal DIN is analog.

Coincidence degrees D1 to Dn between pseudorandom noise P1 to Pn and delay signals S1 to Sn are calculated by coincidence degree calculating circuits M1 to Mn, respectively. Coincidence degree calculating circuits M1 to Mn are, for example, multipliers if pseudorandom noise is 1 or −1, and are exclusive NOR gates if pseudorandom noise is a bit of '1' or '0.' Coincidence degrees D1 to Dn are provided to adder circuit 21 and the sum total thereof is obtained as correlation value DOUT.

With such matched filter 10P, correlation value DOUT is immediately obtained every clock period.

Pseudorandom noises vary from receiver to receiver. When the pseudorandom noise on the receiving side differ from that on the transmitting side, correlation value DOUT is always low, so that the received data cannot be decoded.

For example, for n=256, it is necessary to calculate the sum total of coincidence degrees D1 to D256 in one period of clock CLK. Consequently, construction of adder circuit 21, the correlation value calculating circuit, the matched filter and the communication device is complicated.

SUMMARY OF THE INVENTION

Accordingly, an object of the present invention is to provide an average value calculating circuit having a simpler construction, and a correlation value calculating circuit, a matched filter and a communication device using the same.

In the 1st aspect of the present invention, as shown in FIG. 1 for example, there is provided an average value calculating circuit comprising: a plurality of capacitors C1 to Cn and a switching circuit 23 for sampling and holding charges corresponding to input signals D1 to Dn to the capacitors C1 to Cn respectively, and for connecting the capacitors C1 to Cn in parallel while isolating the input signals D1 to Dn to output average value corresponding to average voltage of the capacitors C1 to Cn connected in parallel.

Defining that the voltages of the capacitors C1 to Cn are V1 to Vn when the charges corresponding to the input signals D1 to Dn are held at the capacitors C1 to Cn and that the voltages of the capacitors C1 to Cn are DOUT when the capacitors are connected in parallel, since the sum total of the charges held in the capacitors C1 to Cn is invariant before and after the parallel connection, the following equation holds:

$$C1 \cdot V1 + C2 \cdot V2 + \ldots + Cn \cdot Vn = (C0 + C1 + \ldots + Cn)DOUT$$

DOUT is a weighted average value of voltages V1 to Vn corresponding to the input signals D1 to Dn with the weights of voltages V1 to Vn being C1 to Cn, respectively.

According to the 1st aspect of the present invention, since the average value calculating circuit is constituted by capacitors C1 to Cn and switching circuit 23, the construction is simpler than before. Thus, the present invention contributes to reduced manufacture cost of the average value calculating circuit, and the correlation calculating circuit, the matched filter and the communication device using the same.

In the 2nd aspect of the present invention, there is provided an average value calculating circuit as defined in the 1st aspect, wherein one end of each of the capacitors is supplied with a first reference potential, and wherein the switching circuit comprises: a plurality of first switching elements, each connected between a corresponding one of the inputs for receiving the input signals and the other end of a corresponding one of the capacitors; a common conductor; a plurality of second switching elements each connected between the other end of the corresponding one of the capacitors and the common conductor; and a resetting switching element with its one end connected to the common conductor and its other end supplied with a second reference potential, wherein when one of a first group consisting of the first switching elements and the resetting switching element, and a second group consisting of the second switching elements is on, the other thereof is off, substantially.

The 2nd reference potential may be equal to the 1st reference potential.

In the 3rd aspect of the present invention, there is provided an average value calculating circuit as defined in the 2nd aspect, wherein the capacitors comprise: a plurality of first capacitor elements each with its one end supplied with the first reference potential, its other end thereof being the other end of one of the capacitors; a plurality of second capacitor elements each with its one end supplied with a third reference potential; and a plurality of third switching elements each connected between the other end of the corresponding one of the first capacitor elements and the other end of corresponding one of the second capacitor elements.

The 3rd reference potential may be equal to the 1st reference potential.

According to the 3rd aspect of the present invention, by controlling on/off of the 3rd switching elements, the weights of the weighted average become variable.

In the 4th aspect of the present invention, there is provided a correlation value calculating circuit comprising: a coincidence degree calculating circuit for calculating degrees of coincidence between a parallel signal and a pseudorandom noise; a plurality of capacitors; and a switching circuit for sampling and holding charges corresponding to the degrees of coincidence to the capacitors and for connecting the capacitors in parallel while isolating the parallel signal to output average value corresponding to average voltage of the capacitors connected in parallel.

In the 5th aspect of the present invention, there is provided a matched filter comprising: a shift register having a plurality of cascaded delay elements, a first stage of the delay elements receiving a spread spectrum signal, the delay elements being clocked by a clock signal to provide a parallel signal from outputs thereof; a coincidence degree calculating circuit for calculating degrees of coincidence between the parallel signal and a pseudorandom noise; a plurality of capacitors; and a switching circuit for sampling and holding charges corresponding to the degrees of coincidence to the capacitors and for connecting the capacitors in parallel while isolating the parallel signal to output average value corresponding to average voltage of the capacitors connected in parallel.

In the 6th aspect of the present invention, there is provided a matched filter as defined in the 5th aspect, wherein each of the delay elements is a flip-flop, and wherein the coincidence degree calculating circuit comprises exclusive OR gates or exclusive NOR gates, each receiving a bit of the parallel signal and a bit of the pseudorandom noise.

In the 7th aspect of the present invention, there is provided a matched filter as defined in the 5th aspect, wherein each of the delay elements is a sample-and-hold circuit, and wherein the coincidence degree calculating circuit comprises multiplier circuits each receiving a single signal of the parallel signal and a digit of the pseudorandom noise.

In the 8th aspect of the present invention, there is provided a matched filter comprising: a shift register having a plurality of cascaded delay elements, a first stage of the delay elements receiving a spread spectrum signal, the delay elements being clocked by a clock signal to provide a parallel signal from outputs thereof; a coincidence degree calculating circuit for calculating degrees of coincidence between the parallel signal and a pseudorandom noise; a plurality of capacitors each having one end supplied with a first reference potential; a plurality of first switching elements each connected between the output of a corresponding one of the delay elements and the other end of a corresponding one of the capacitors; a common conductor; a plurality of second switching elements connected between the other end of a corresponding one of the capacitors and the common conductor; and a resetting switching element with its one end connected to the common conductor and its other end supplied with a second reference potential; wherein the capacitors comprise: a plurality of first capacitor elements each with its one end supplied with the first reference potential the, other end thereof being the other end of a corresponding one of the capacitors; a plurality of second capacitor elements each with its one end supplied with a third reference potential; and a plurality of third switching elements each connected between the other end of a corresponding one of the first capacitor elements and its other end of a corresponding one of the second capacitor elements, wherein when one of a first group consisting of the first switching elements and the resetting switching element, and a second group consisting of the second switching elements is on, the other thereof is off, substantially, and wherein the third switching elements are controlled by weight data.

In the 9th aspect of the present invention, there is provided a multi-bit matched filter receiving a multi-bit stream of a spread spectrum signal and including matched filters, each of the matched filters comprising: a shift register having a plurality of cascaded delay elements, a first stage of the delay elements receiving one bit stream of the multi-bit stream, the delay elements being clocked by a clock signal to provide a parallel signal from outputs thereof; a coincidence degree calculating circuit for calculating degrees of coincidence between the parallel signal and part of a pseudorandom noise; a plurality of capacitors; and a switching circuit for sampling and holding charges corresponding to the degrees of coincidence to the capacitors and for connecting the capacitors in parallel while isolating the parallel signal to output average value corresponding to average voltage of the capacitors connected in parallel, as a correlation value from a correlation value output.

According to the 9th aspect of the present invention, since it is only necessary to connect the correlation output of the matched filters to a common conductor, the construction of a multi-bit matched filter can be simplified.

In the 10th aspect of the present invention, there is provided a multi-bit matched filter as defined in the 9th aspect, wherein a capacitance of each of the capacitors within a jth matched filter is twice a capacitance of each of the capacitors within a (j−1)th matched filter for each j of 2 to m, where 1st to mth matched filters construct the matched filters of the multi-bit matched filter, and the multi-bit matched filter further comprising a common conductor to which the correlation value outputs of the 1st to mth matched filters are connected.

In the 11th aspect of the present invention, there is provided a multi-bit matched filter as defined in the 9th aspect, further comprising a weighted average calculating circuit for calculating a weighted average of the correlation values output from the matched filters in such a way that a weight for a correlation value output from a jth matched filter is twice a weight for a correlation value output from a (j−1)th matched filter for each j of 2 to m, where 1st to mth matched filters construct the matched filters of the multi-bit matched filter.

According to the 11th aspect of the present invention, matched filters having the same construction can be used.

In the 12th aspect of the present invention, there is provided a multi-bit matched filter as defined in the 11th aspect, wherein the weighted averaged calculating circuit comprises: 1st to mth analog-to-digital converter circuits each connected at its input to an output a of corresponding one of the 1st to mth matched filters; 1st to (m−1)th multiplier circuits each connected to an output a of corresponding one of the 2nd to mth analog-to-digital converter circuits, the 1st to (m−1)th multiplier circuits multiplying outputs of the 2nd to mth analog-to-digital converter circuits by k2 to km, respectively; and an adder circuit for calculating a sum total of an output of the 1st analog-to-digital converter circuit and outputs of the 2nd to mth multiplier circuits, wherein a ratio rj=kj/(resolution of a jth analog-to-digital converter circuit) is twice a ratio r(j−1) for each of j=2 to m.

According to the 12th aspect of the present invention, by using 2nd to mth multiplier circuits, 2nd to mth analog-to-digital converter circuits having comparatively low resolution can be used.

In the 13th aspect of the present invention, there is provided a communication device including a matched filter, the matched filter comprising: a shift register having a plurality of cascaded delay elements, a first stage of the delay elements receiving a spread spectrum signal, the delay elements being clocked by a clock signal to provide a parallel signal from outputs thereof; a coincidence degree calculating circuit for calculating degrees of coincidence between the parallel signal and a pseudorandom noise; a plurality of capacitors; and a switching circuit for sampling and holding charges corresponding to the degrees of coincidence to the capacitors and for connecting the capacitors in parallel while isolating the parallel signal to output average value corresponding to average voltage of the capacitors connected in parallel.

DESCRIPTION OF THE PREFERRED EMBODIMENTS

Figure 1:
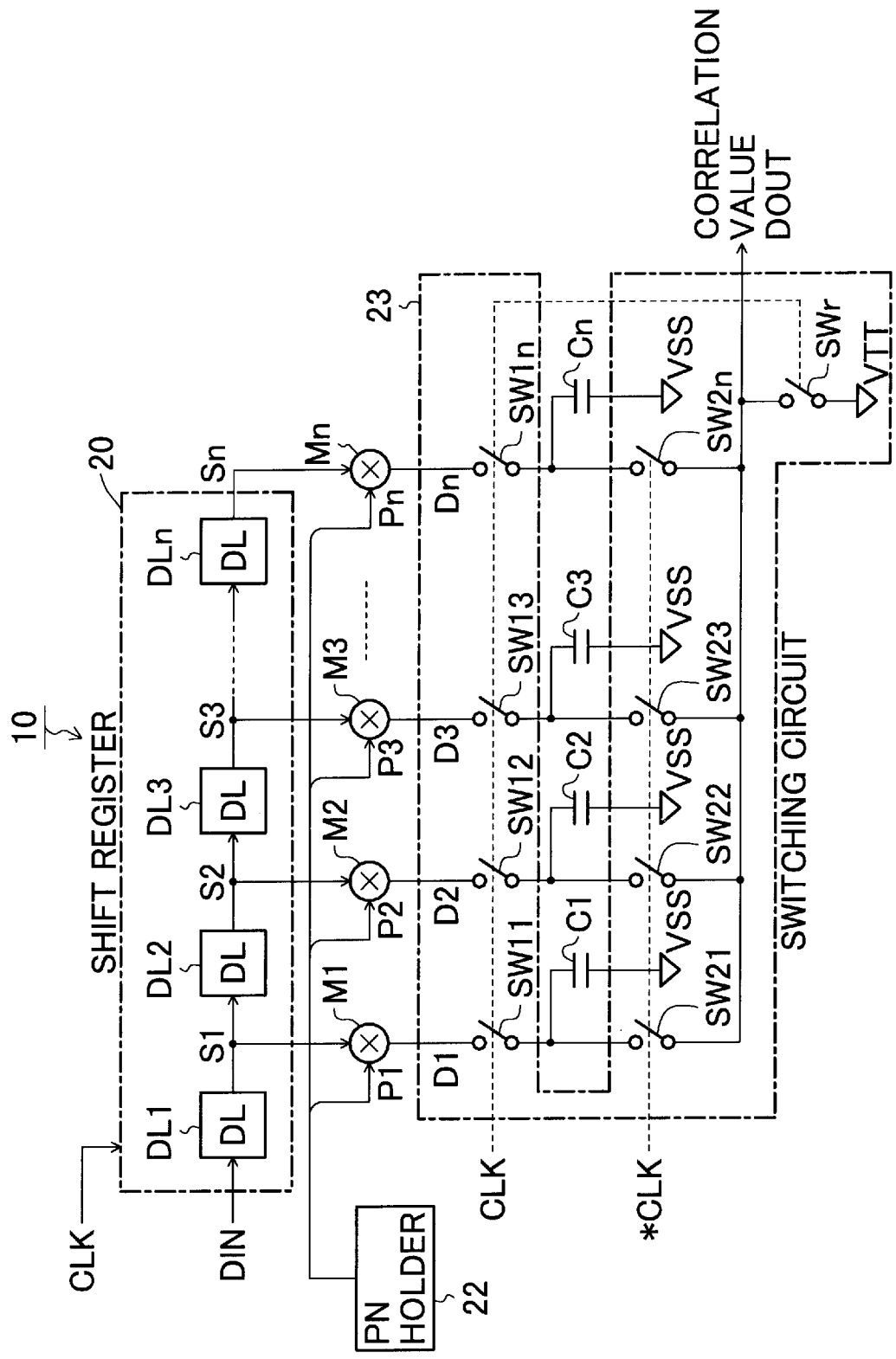
FIG. 1 is a circuit diagram of a matched filter showing a principal construction of the present invention.

Referring now to the drawings, wherein like reference characters designate like or corresponding parts throughout several views, preferred embodiments of the present invention are described below.

First Embodiment

Figure 2:
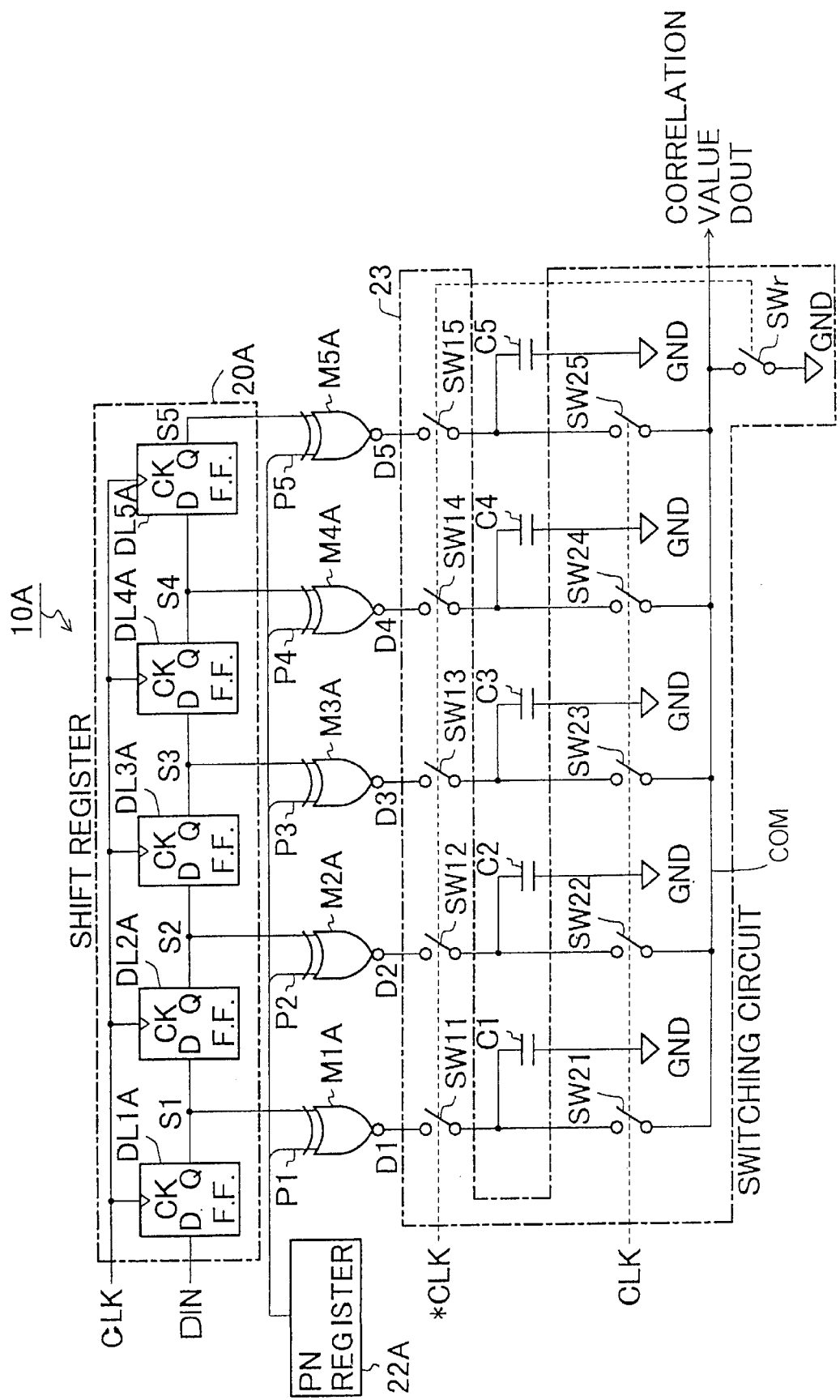
FIG. 2 is a circuit diagram of a matched filter according to a first embodiment of the present invention.

FIG. 2 shows matched filter 10A according to a first embodiment of the present invention. Matched filter 10A is used, for example, instead of matched filter 10P of FIG. 8. Matched filter 10A is a structural example of FIG. 1 and is used in the case that spread spectrum signal DIN is a bit stream. For simplicity in FIG. 2, n of FIG. 1 is equal to 5.

In shift register 20A, D flip-flops DL1A to DL5A are cascaded and clocked by clock CLK. To data input D of D flip-flop DL1A in the first stage, spread spectrum signal DIN is provided. Outputs S1 to S5 of D flip-flops DL1A to DL5A are provided to one input of exclusive NOR gates M1A to M5A. To the other input of exclusive NOR gates M1A to M5A, pseudorandom noises P1 to P5 are provided from pseudorandom noise register 22A. For example, if P1=S1 then D1='1', and if P1≠S1 then D1='0.' Outputs D1 to D5 of exclusive NOR gate M1A to M5A represent degrees of coincidence of delay signals S1 to S5 with pseudorandom noises P1 to P5.

Capacitors C1 to C5 have the same capacitance. One end of each of the capacitors C1 to C5 is connected to ground line GND. The other ends thereof are connected, on the one hand, through switching elements SW11 to SW15 to the outputs of exclusive NOR gates M1A to M5A and on the other hand, through switching elements SW21 to SW25 to common line COM. Between common line COM and ground line GND, switching element SWr for resetting common line potential is connected. Switching elements SW11 to SW15, SW21 to SW25 and SWr constitute switching circuit 23 for capacitors C1 to C5.

Switching elements SW11 to SW15 and SWr are on when clock *CLK is high, and are off when clock *CLK is low. Switching elements SW21 to SW25 are on when clock CLK which is complementary to clock *CLK is high, and are off when clock CLK is low.

Switching circuit 23 and capacitors C1 to C5 constitute an average value calculating circuit. The average value calculating circuit and exclusive NOR gates M1A to M5A constitute a correlation value calculating circuit.

Figure 3:
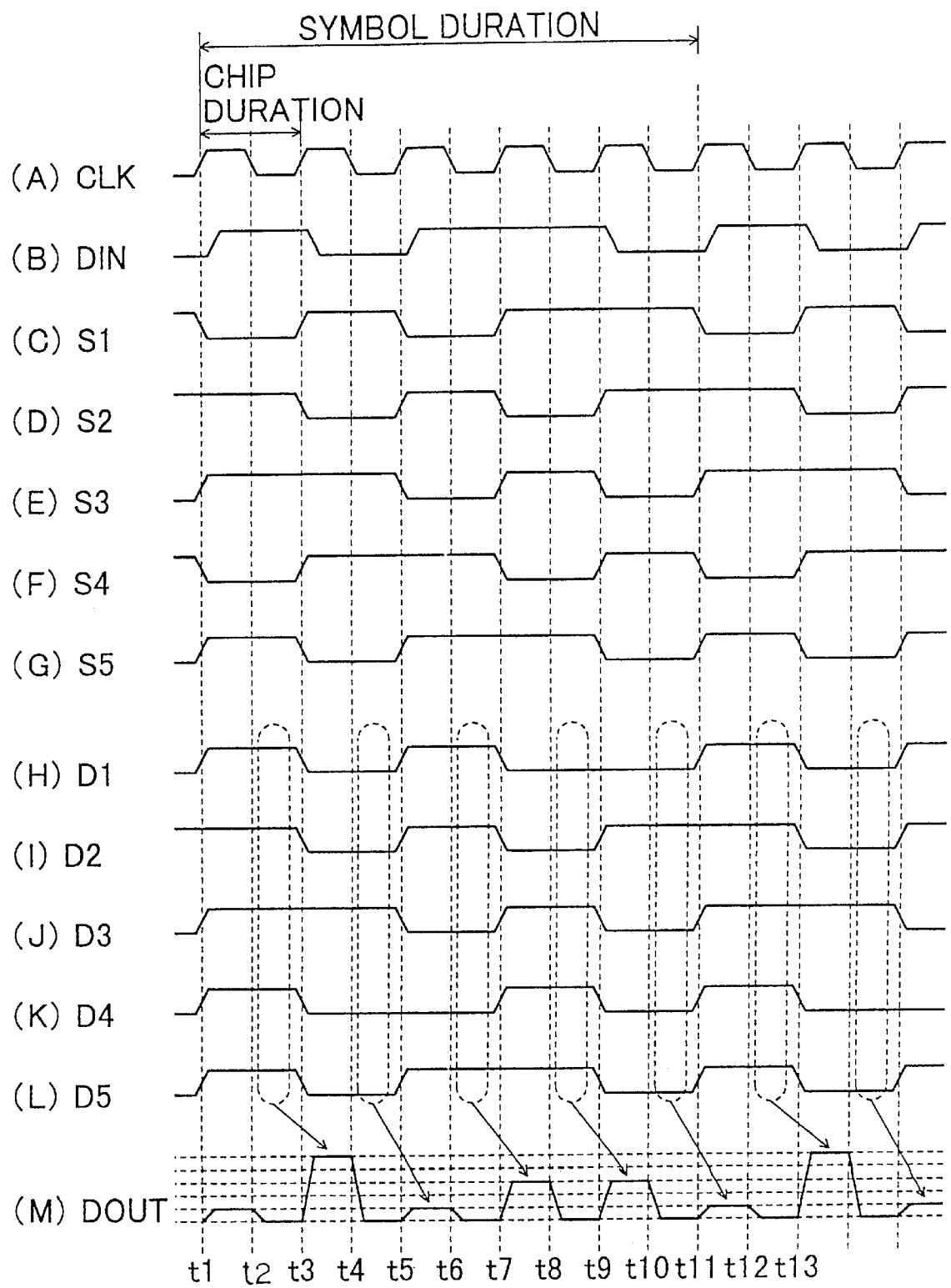
FIG. 3 is a time chart showing an operation of the circuit of FIG. 1.

Next, an operation of matched filter 10A thus constructed will be described with reference to FIG. 3. FIG. 3 shows a case where pseudorandom noise P1 to P5 is '01101' and at time t=t1, spread spectrum signal DIN is '0' and data of delay signals S1 to S4 is '1101.' One cycle of clock CLK is called chip duration. Hereinafter, i of time ti will represent an odd number.

Spread spectrum signal DIN and delay signals S1 to S4 are held in flip-flops DL1A to DL5A at the rise timing (ti) of clock CLK, and the flip-flops output them as delay signals S1 to S5.

For example, at time t=t1, data of delay signals S1 to S5 are changing to '01101' and data of outputs D1 to D5 of exclusive NOR gates M1A to M5A are changing to '11111.' At time t=t3, data of delay signals S1 to S5 are changing to '10110' and data of outputs D1 to D5 of exclusive NOR gates M1A to M5A are changing to '00100.'

At the rise of clock CLK, switching elements SW11 to SW15 and SWr are going to be turned off, and next switching elements SW21 to SW25 are going to be turned on. The voltages of capacitors C1 to C5 immediately therebefore are designated as V1 to V5, respectively. Since the sum total of the charges held in capacitors C1 to C5 and common line COM is invariant before and after the rise of clock CLK, the equation $$C1 \cdot V1 + C2 \cdot V2 + C3 \cdot V3 + C4 \cdot V4 + C5 \cdot V5 = (C0 + C1 + C2 + C3 + C4 + C5)DOUT \quad (1)$$

is satisfied, where C0 represents the capacitance of common line COM. Assuming that capacitance C0 is ignorable as against the sum total of the capacitances of capacitors C1 to C5, correlation value DOUT is an average value of voltages V1 to V5 corresponding to coincidence degrees D1 to D5, weighted with the capacitances of capacitors C1 to C5. When capacitors C1 to C5 are equal to one another, correlation value DOUT is a mere average value of voltages V1 to V5. That is, correlation value DOUT is an analog-converted value of the average of coincidence degrees D1 to D5 of one cycle before.

Figure 8:
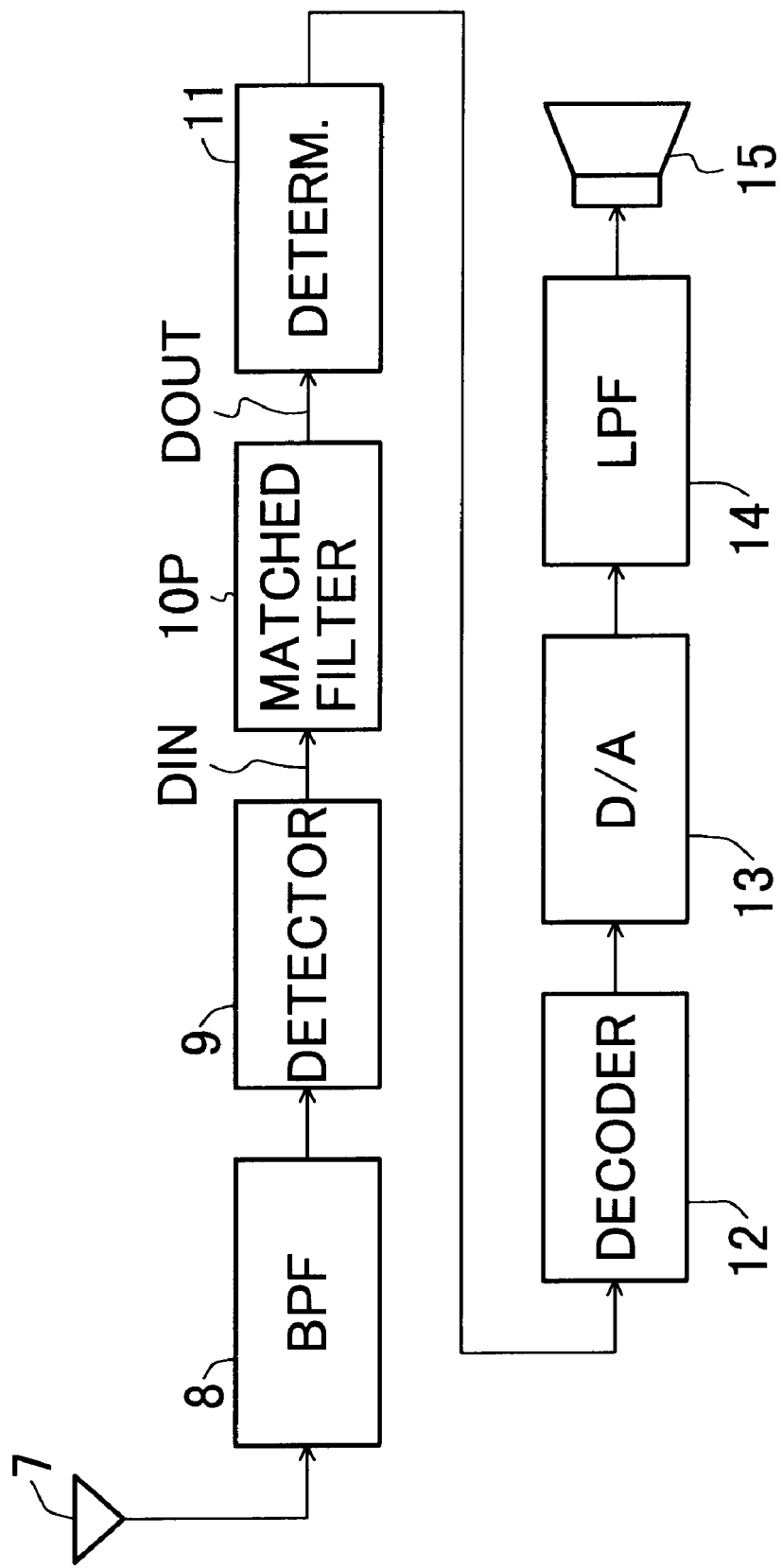
FIG. 8 is a block diagram showing a schematic construction of a conventional receiver for direct sequence spread spectrum communication.

In FIG. 3, since correlation value DOUT is changing to the "maximum value" at time t=t3 and t=13, after this change, determining circuit 11 of FIG. 8 determines that a duration from t1 to t11 of one cycle before is one symbol duration. The same determination is performed when correlation value DOUT is the "minimum value." In addition, when correlation value DOUT is the "maximum value" or "minimum value", determining circuit 11 determines that the baseband data in the one symbol duration is '1' or '0', respectively. In actuality, in consideration of mixing of noises and interference of received radio waves, a "value equal to or higher than a set value slightly lower than the maximum value" is used instead of the "maximum value", and a "value equal to or lower than a set value slightly higher than the minimum value" is used instead of the "minimum value."

At the rise timing (ti+1) of clock CLK, switching elements SW21 to SW25 are going to be turned off, and next, switching elements SW11 to SW15 and SWr are going to be turned on. After this, voltages corresponding to coincidence degrees D1 to D5 are sampled at capacitors C1 to C5, respectively, and common line COM is reset to the ground potential.

Figure 9:
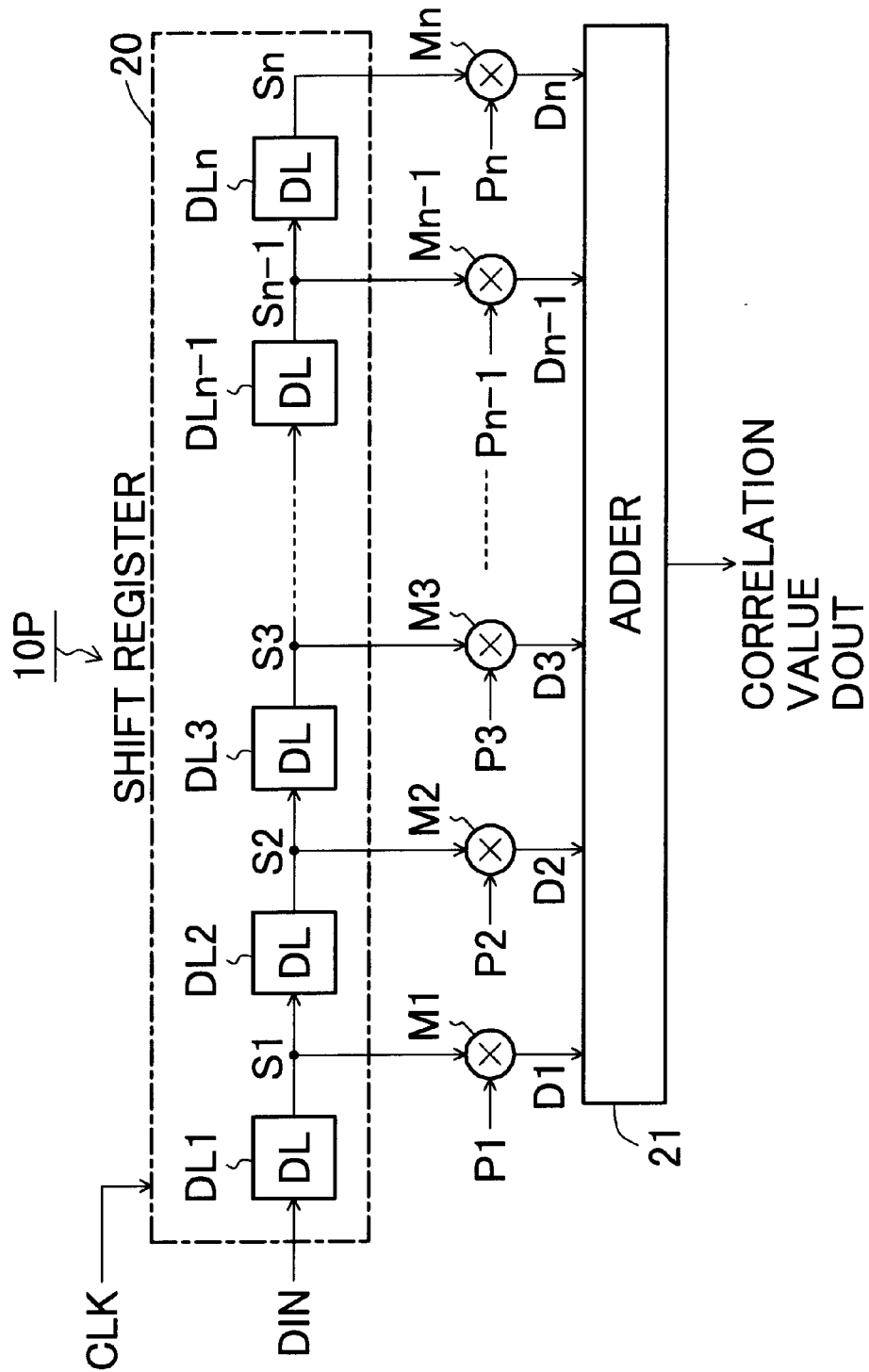
FIG. 9 is circuit diagram of a conventional matched filter.

According to the first embodiment, since an average value calculating circuit corresponding to adder circuit 21 of FIG. 9 is constituted by capacitors C1 to C5 and switching circuit 23, the construction of the average value calculating circuit, and the correlation value calculating circuit, matched filter 10A and the communication device using the same can be simpler than before.

Second Embodiment

Figure 4:
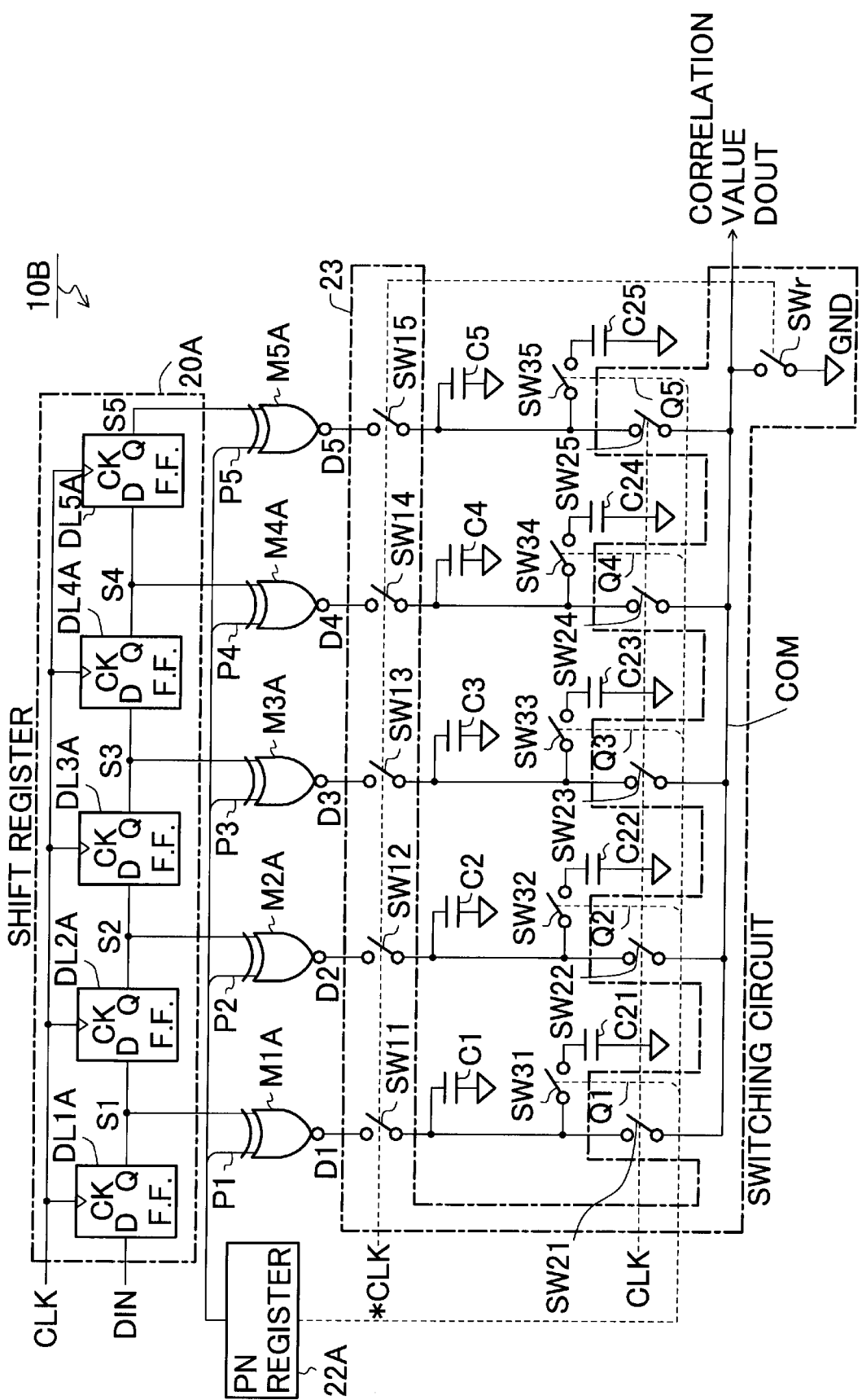
FIG. 4 is a circuit diagram of a matched filter according to a second embodiment of the present invention.

In order to improve the capability of excluding interference waves in relation to the values of the pseudorandom noises, there is a case that each digit of the pseudorandom noise has two bits only on the receiving side. FIG. 4 shows matched filter 10B according to a second embodiment of the present invention that takes such case into consideration.

In matched filter 10B, capacitors C1 to C5 are connected through switching elements SW31 to SW35 to capacitors C21 to C25 in parallel, respectively. The capacitances of capacitors C1 to C5 and C21 to C25 are the same.

Each digit of the pseudorandom noise output from pseudorandom noise register 22A has two bits. All the bits having the higher-order bit of each digit are provided as P1 to P5 to one input of exclusive NOR gates M1A to M5A, respectively, and all the bits of the lower-order bit of each digit are provided as Q1 to Q5 to the control input of switching elements SW31 to SW35, respectively.

From the equation (1), correlation value DOUT is proportional to a weighted average value of coincidence degrees D1 to D5 and the weights are variable according to Q1 to Q5. Assuming that the average value of the maximum value and the minimum value of correlation value DOUT is 0, if the digits P1Q1 to P5Q5 of the pseudorandom noise are '11', '10', '00' and '01', the weights are 1, 0.5, −0.5 and −1, respectively.

Third Embodiment

Figure 5:
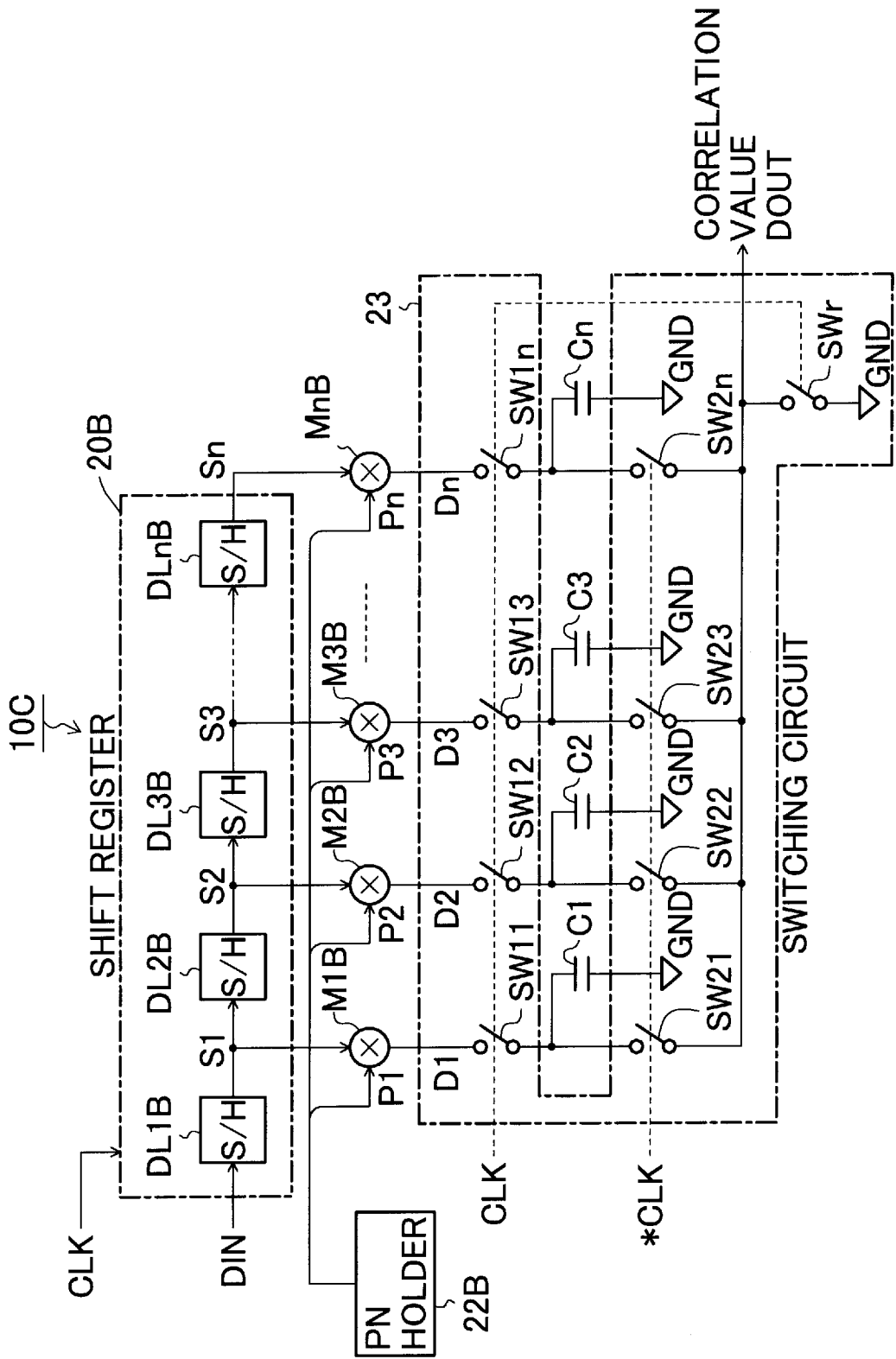
FIG. 5 is a circuit diagram of a matched filter according to a third embodiment of the present invention.

Spread spectrum signal DIN may be an analog voltage. FIG. 5 shows matched filter 10C according to a third embodiment of the present invention in which filter 10C takes this into consideration.

In analog shift register 20B, sample-and-hold circuits DL1B to DLnB are cascaded. As the coincidence degree calculating circuits, multiplier circuits M1B to MnB are used. Pseudorandom noise P1 to Pn output from pseudorandom noise holding circuit 22B are all analog voltages corresponding to '1' or '−1'.

Other features are the same as those of FIG. 2.

Instead of sample-and-hold circuits DL1B to DLnB, CCDs may be used.

Fourth Embodiment

Figure 6:
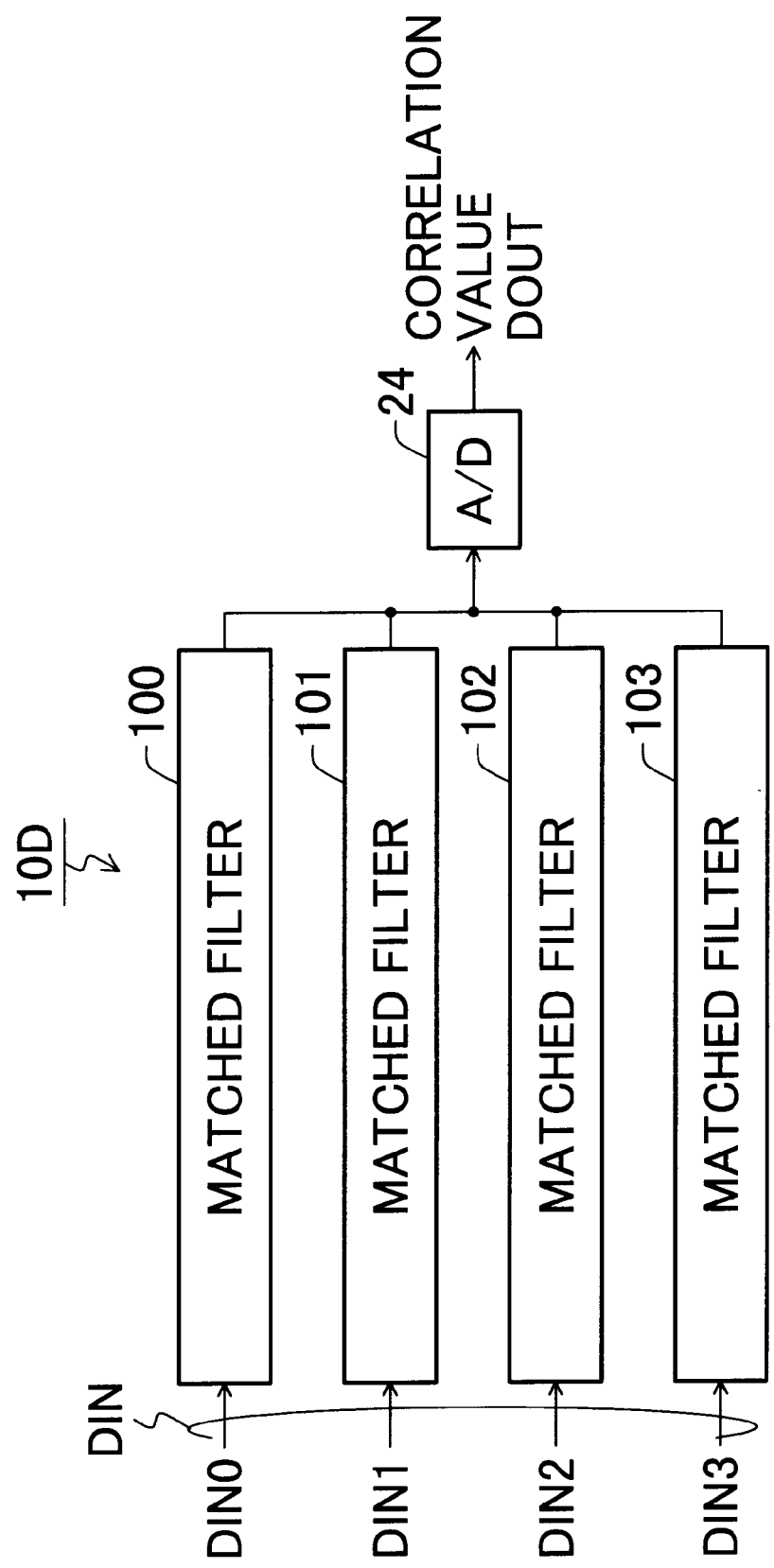
FIG. 6 is a circuit diagram of a matched filter according to a fourth embodiment of the present invention.

While spread spectrum signal DIN is a one-bit stream in the above-described embodiments, spread spectrum signal DIN may be a multi-bit stream. FIG. 6 shows matched filter 10D according to a fourth embodiment of the present invention in which filter 10D takes this into consideration.

It is assumed that spread spectrum signal DIN is a 4-bit stream of DIN0 to DIN3 and that DIN0 is the least significant bit. Spread spectrum signals DIN0 to DIN3 are provided to matched filters 100 to 103, respectively. Matched filters 100 to 103 all have the same construction as, for example, matched filter 10A shown in FIG. 2, with the proviso that capacitances C of capacitors C1 to C5 of FIG. 2 are different among matched filters 100 to 103 and the capacitance ratio thereof is 1:2:4:8.

The correlation value output of matched filters 100 to 103 are all connected to the input of analog-to-digital converter circuit 24. The input voltage of analog-to-digital converter circuit 24 is a weighted average value of the output voltages of matched filters 100 to 103 before the connection of the outputs. The weights are the above-mentioned capacitance ratio. From analog-to-digital converter circuit 24, digital correlation value DOUT is taken out.

Fifth Embodiment

In FIG. 6, it is necessary that the capacitances of capacitors C1 to C5 shown in FIG. 2 in matched filter 100 for the least significant bit be a certain value or higher in consideration of a variation in parasitic capacitance. Moreover, since the capacitances of the capacitors are decided by the above-mentioned capacitance ratio, the areas occupied by the capacitors of matched filter 103 for the most significant bit increases.

Figure 7:
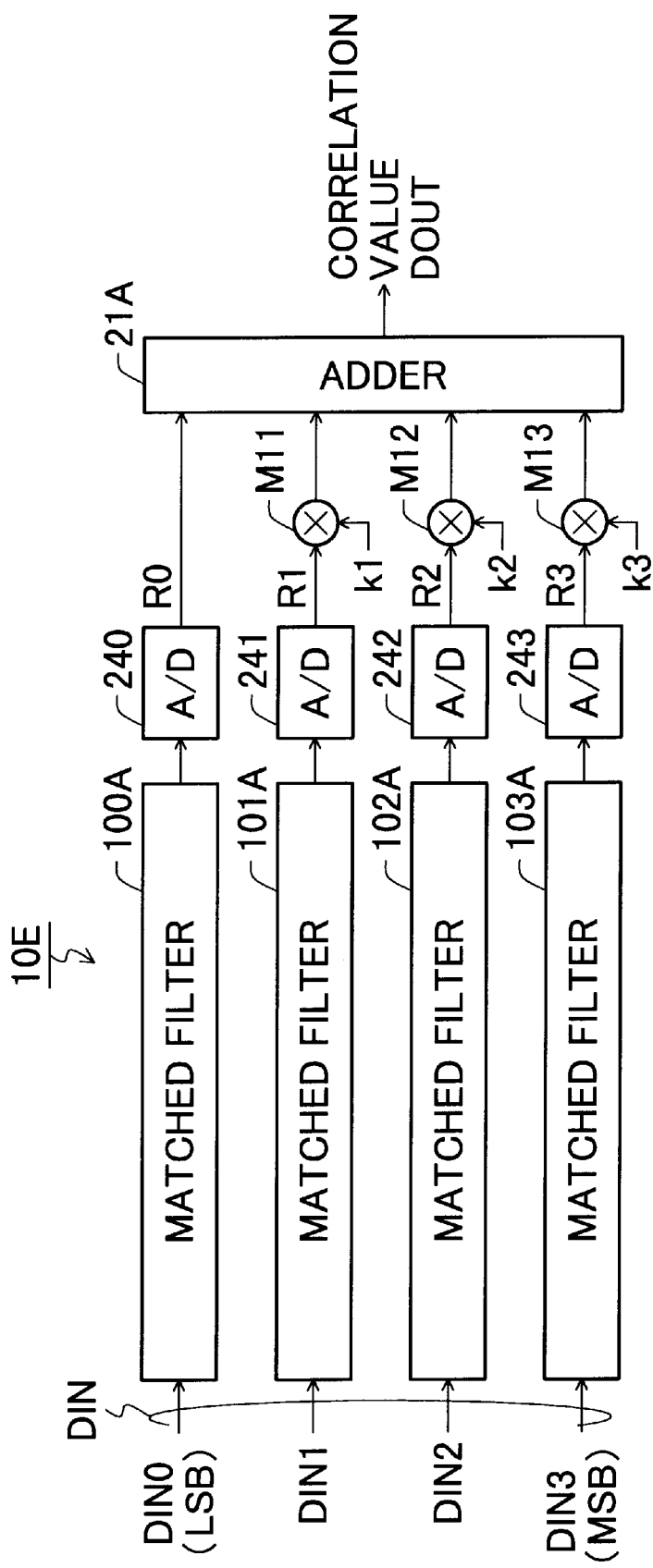
FIG. 7 is a circuit diagram of a matched filter according to a fifth embodiment of the present invention.

Therefore, in matched filter 10E according to a fifth embodiment shown in FIG. 7, the capacitances of the capacitors C1 to C5 shown in FIG. 2 are the same for all of matched filters 100A to 103A.

The output voltages of matched filters 100A to 103A are digitized by analog-to-digital converter circuits 240 to 243, respectively. Outputs R1 to R3 of analog-to-digital converter circuits 241 to 243 are multiplied by k1 to k3 by multiplier circuits M11 to M13, respectively, and are provided to adder circuit 21A together with output RO of analog-to-digital converter circuit 240. The sum total thereof is obtained as digital correlation value DOUT.

When resolutions of analog-to-digital converter circuits 240 to 243 are VDD/N0 to VDD/N3, N1·k1/N0=2, N2·k2/N0=$2^2$ and N3·k3/N0=$2^3$.

The resolution of correlation value DOUT is VDD·n/($2^4$ N0), where n is of FIG. 1.

Although preferred embodiments of the present invention have been described, it is to be understood that the invention is not limited thereto and that various changes and modifications may be made without departing from the spirit and scope of the invention.

For example, in FIG. 7, if multipliers k1, k2 and k3 are $2^j$, without the use of multiplier circuits M11 to M3, output wirings of analog-to-digital converter circuits to 243 are shifted by j bits toward the higher-order and connected to the input of adder circuit 21A. over, an arrangement may be used in which analog-total converter circuits having reference voltage input used as circuits 240 to 243, the multipliers k1, k2 and re set so that k1=k2=k3=1 with appropriate reference ages, and multiplier circuits M11 to M13 are omitted.

What is claimed is:

1. A matched filter comprising:
   a shift register having a plurality of cascaded delay elements, a first stage of said delay elements receiving a spread spectrum signal, said delay elements being clocked by a clock signal to provide a parallel signal from outputs thereof;
   a coincidence degree calculating circuit for calculating degrees of coincidence between said parallel signal and a pseudorandom noise;
   a plurality of capacitors each having one end supplied with a first reference potential;
   a plurality of first switching elements each connected between said output of corresponding one of said delay elements and other end of corresponding one of said capacitors;

a common conductor;

a plurality of second switching elements connected between said other end of corresponding one of said capacitors and said common conductor; and a resetting switching element with its one end connected to said common conductor and its other end supplied with a second reference potential;

wherein said capacitors comprises:

a plurality of first capacitor elements each with its one end supplied with said first reference potential, other end thereof being said other end of corresponding one of said capacitors;

a plurality of second capacitor elements each with its one end supplied with a third reference potential; and a plurality of third switching elements each connected between said other end of corresponding one of said first capacitor elements and its other end of corresponding one of said second capacitor elements, wherein when one of a first group consisting of said first switching elements and said resetting switching element, and a second group consisting of said second switching elements is on, the other thereof is off, substantially, and wherein said third switching elements are controlled by weight data.

2. A communication device including a matched filter, said matched filter comprising:

a shift register having a plurality of cascaded delay elements, a first stage of said delay elements receiving a spread spectrum signal, said delay elements being clocked by a clock signal to provide a parallel signal from outputs thereof;

a coincidence degree calculating circuit for calculating degrees of coincidence between said parallel signal and a pseudorandom noise;

a plurality of capacitors each having one end supplied with a first reference potential;

a plurality of first switching elements each connected between an output of corresponding one of said delay elements and other end of corresponding one of said capacitors;

a common conductor;

a plurality of second switching elements each connected between said other end of corresponding one of said capacitors and said common conductor; and a resetting switching element with its one end connected to said common conductor and its other end supplied with a second reference potential;

wherein said capacitors comprises:

a plurality of first capacitor elements each with its one end supplied with said first reference potential, other end thereof being said other end of corresponding one of said capacitors;

a plurality of second capacitor elements each with its one end supplied with a third reference potential; and a plurality of third switching elements each connected between said other end of corresponding one of said first capacitor elements and its other end of corresponding one of said second capacitor elements, wherein when one of a first group consisting of said first switching elements and said resetting switching element, and a second group consisting of said second switching elements is on, the other thereof is off, substantially, and wherein said third switching elements are controlled by weight data.

3. An average value calculating circuit, comprising:

a plurality of capacitors having a first end and a second end, each second end being supplied with a first reference potential; and a switching circuit sampling and holding charges corresponding to input signals to said capacitors and connecting said capacitors in parallel while isolating the input signals to output an average value corresponding to an average voltage of said capacitors, said switching circuit comprising:

a plurality of first switching elements, a first end of each first switching element connected to an input for receiving the input signals and a second end connected to a corresponding first end of one of said capacitors, a common conductor, a plurality of second switching elements, a first end of each second switching element connected to the first end of each corresponding capacitor and a second end connected to said common conductor, and a resetting switching element having a first end connected to said common conductor and a second end supplied with a second reference potential, wherein said first switching elements and said resetting switching element comprise a first group, and said second switching elements comprise a second group, and when one of the first and second groups is on, the other thereof is off.

4. An average value calculating circuit according to claim 3, wherein said capacitors comprise:

a plurality of first capacitor elements, each having a first end and a second end, the second end supplied with the first reference potential, and the first end connected to the second end of a corresponding one of said first switching elements;

a plurality of second capacitor elements, each having a first end and a second end, the second end supplied with a third reference potential; and a plurality of third switching elements having a first end and a second end, the first end of each third switching element connected to the second end of a corresponding one of said first capacitor elements, and the second end of each third switching element connected to the second end of a corresponding one of said second capacitor elements.

5. A correlation value calculating circuit, comprising:

a coincidence degree calculating circuit calculating a coincidence degree between each of a plurality of input signals and corresponding digits of a pseudorandom noise, and having outputs providing each of the coincidence degrees;

a plurality of capacitors having a first end and a second end, each second supplied with a first reference potential; and a switching circuit, comprising:

a plurality of first switching elements, a first end of each first switching element connected to a corresponding one of the outputs of the coincidence degrees, and a second end of each first switching element connected to a corresponding first end of one of said capacitors, a common conductor, a plurality of second switching elements, a first end of each second switching element connected to the first end of each corresponding capacitor and a second end connected to said common conductor, and a resetting switching element having a first end connected to said common conductor and a second end supplied with a second reference potential, wherein said first switching elements and said resetting switching element comprise a first group, and said second switching elements comprise a second group, and when one of the first and second groups is on, the other thereof is off.

6. A matched filter comprising:

a shift register having a plurality of cascaded delay elements, a first one of said delay elements receiving a spread spectrum signal, the delay elements being clocked by a clock signal to provide delayed signals from outputs thereof;

a coincidence degree calculating circuit calculating a coincidence degree between each of the delayed signals and corresponding digits of a pseudorandom noise, and having outputs providing each of the coincidence degrees;

a plurality of capacitors, each having a first end and a second end, each second end supplied with a first reference potential; and a switching circuit, comprising:

a plurality of first switching elements, a first end of each first switching element connected to a corresponding one of the outputs of the coincidence degrees, and a second end of each first switching element connected to a corresponding first end of one of said capacitors, a common conductor, a plurality of second switching elements, a first end of each second switching element connected to the first end of each corresponding capacitor and a second end connected to said common conductor, and a resetting switching element having a first end connected to said common conductor and a second end supplied with a second reference potential, wherein said first switching elements and said resetting switching element comprise a first group, and said second switching elements comprise a second group, and when one of the first and second groups is on, the other thereof is off.

7. A matched filter according to claim 6, wherein each of the delay elements is a flip-flop; and wherein said coincidence degree calculating circuit comprises exclusive OR gates or exclusive NOR gates, each receiving a bit of the delayed signals and a bit of the pseudorandom noise.

8. A matched filter according to claim 6, wherein each of the delay elements is a sample-and-hold circuit; and wherein said coincidence degree calculating circuit comprises multiplier circuits, each receiving one of the delayed signals and one digit of the pseudorandom noise.

9. A multi-bit matched filter receiving a multi-bit stream of a spread spectrum signal into a plurality of corresponding matched filters, each of said matched filters comprising:

a shift register having a plurality of cascaded delay elements, a first one of said delay elements receiving a spread spectrum signal, the delay elements being clocked by a clock signal to provide delayed signals from outputs thereof;

a coincidence degree calculating circuit calculating a coincidence degree between each of said delayed signals and corresponding digits of a pseudorandom noise, and having outputs providing each of the coincidence degrees;

a plurality of capacitors, each having a first end and a second end, each second end supplied with a first reference potential; and a switching circuit, comprising:

a plurality of first switching elements, a first end of each first switching element connected to a corresponding one of the outputs of the coincidence degrees, and a second end of each first switching element connected to a corresponding first end of one of said capacitors, a common conductor, a plurality of second switching elements, a first end of each second switching element connected to the first end of each corresponding capacitor and a second end connected to said common conductor, and a resetting switching element having a first end connected to said common conductor and a second end supplied with a second reference potential, wherein said first switching elements and said resetting switching element comprise a first group, and said second switching elements comprise a second group, and when one of the first and second groups is on, the other thereof is off.

10. A multi-bit matched filter according to claim 9, wherein a capacitance of each of said capacitors within a jth matched filter is twice a capacitance of each of said capacitors within a (j−1)th matched filter for each j from 2 to m, where first to mth matched filters comprises said matched filters of said multi-bit matched filter; and said multi-bit matched filter further comprising a common conductor to which correlation value outputs of the first to mth matched filters are connected.

11. A multi-bit matched filter according to claim 9, further comprising a weighted average calculating circuit calculating a weighted average of the correlation values output from said matched filters such that a weight for a correlation value output from a jth matched filter is twice a weight for a correlation value output from a (j−1)th matched filter for each j from 2 to m, where first to mth matched filters comprise said matched filters of said multi-bit matched filter.

12. A multi-bit matched filter according to claim 11, wherein said weighted average calculating circuit comprises:

first to mth analog-to-digital converter circuits, each connected at an input to an output of a corresponding one of said first to mth matched filters;

first to (m−1)th multiplier circuits, each connected to an output of a corresponding one of said second to mth analog-to-digital converter circuits by k2 to km, respectively; and an adder circuit calculating a sum total of an output of said first analog-to-digital converter circuit and outputs of said second to mth multiplier circuits, wherein a ratio rj−kj/(resolution of a jth analog-to-digital converter circuit) is twice a ratio (j−1) for each j from 2 to m.

13. A communication device having a matched filter, said matched filter comprising:

a shift register having a plurality of cascaded delay elements, a first one of said delay elements receiving a spread spectrum signal, the delay elements being clocked by a clock signal to provide delayed signals from outputs thereof;

a coincidence degree calculating circuit calculating a coincidence degree between each of said delayed signals and corresponding digits of a pseudorandom noise, and having outputs providing each of the coincidence degrees;

a plurality of capacitors, each having a first end and a second end, each second end supplied with a first reference potential; and a switching circuit, comprising:

a plurality of first switching elements, a first end of each first switching element connected to a corresponding one of the outputs of the coincidence degrees, and a second end of each first switching element connected to a corresponding first end of one of said capacitors, a common conductor, a plurality of second switching elements, a first end of each second switching element connected to the first end of each corresponding capacitor and a second end connected to said common conductor, and a resetting switching element having a first end connected to said common conductor and a second end supplied with a second reference potential, wherein said first switching elements and said resetting switching element comprise a first group, and said second switching elements comprise a second group, and when one of the first and second groups is on, the other thereof is off.

14. A matched filter, comprising:

a plurality of first capacitor elements, each having a first end and a second end, the second end supplied with a first reference potential;

a plurality of first switching elements, a first end of each first switching element connected to a corresponding one of a plurality of delay elements, and a second end of each first switching element connected to a corresponding first end of one of said first capacitor elements;

a resetting switching element having a first end connected to a common conductor and a second end supplied with a second reference potential;

a plurality of second capacitor elements, each having a first end and a second end, the second end supplied with a third reference potential;

a plurality of second switching elements, each having a first end and a second end, the first end of each second switching element connected to the first end of a corresponding one of said first capacitor elements, and the second end of each second switching element connected to the common conductor; and a plurality of third switching elements, each having a first end and a second end, the first end of each third switching element connected to the first end of a corresponding one of said first capacitor elements, and the second end of each third switching element connected to the first end of a corresponding one of said second capacitor elements.

* * * * *

UNITED STATES PATENT AND TRADEMARK OFFICE
CERTIFICATE OF CORRECTION

PATENT NO. : 6,208,685 B1
DATED : March 27, 2001
INVENTOR(S) : Hiroshi Yamazaki

It is certified that error appears in the above-identified patent and that said Letters Patent is hereby corrected as shown below:

Column 12,
Line 60, change (j-1) to -- r(j-1) --.

Signed and Sealed this

Sixth Day of November, 2001

Attest:

NICHOLAS P. GODICI
Attesting Officer   Acting Director of the United States Patent and Trademark Office